US012222404B2

(12) United States Patent
Hsieh

(10) Patent No.: US 12,222,404 B2
(45) Date of Patent: Feb. 11, 2025

(54) CURRENT LOAD CIRCUIT AND CHIP FOR TESTING POWER SUPPLY CIRCUIT

(71) Applicant: REALTEK SEMICONDUCTOR CORPORATION, Hsinchu (TW)

(72) Inventor: Han-Chieh Hsieh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 434 days.

(21) Appl. No.: 17/840,826

(22) Filed: Jun. 15, 2022

(65) Prior Publication Data

US 2023/0037496 A1    Feb. 9, 2023

(51) Int. Cl.
*G01R 31/40* (2020.01)
*H03K 19/21* (2006.01)

(52) U.S. Cl.
CPC ............. *G01R 31/40* (2013.01); *H03K 19/21* (2013.01)

(58) Field of Classification Search
CPC ......... G01R 31/40; G01R 31/42; H03K 19/21
See application file for complete search history.

(56) References Cited

U.S. PATENT DOCUMENTS

| 5,397,999 | A | 3/1995 | Kanamaru | |
|---|---|---|---|---|
| 6,952,619 | B2 * | 10/2005 | Fujii | G06F 1/26 455/343.1 |
| 7,333,860 | B2 * | 2/2008 | Fujii | G06F 1/28 700/297 |
| 7,436,200 | B1 * | 10/2008 | Jacobsen | G01R 31/40 324/764.01 |
| 8,046,088 | B2 * | 10/2011 | Fujii | H02J 1/10 700/297 |
| 8,593,171 | B2 * | 11/2013 | Kosonocky | G01R 31/40 324/764.01 |
| 9,341,652 | B2 * | 5/2016 | Remnas | G01R 31/40 |
| 9,964,598 | B2 * | 5/2018 | Remnås | G01R 31/40 |

\* cited by examiner

*Primary Examiner* — Judy Nguyen
*Assistant Examiner* — James Split
(74) *Attorney, Agent, or Firm* — WPAT, P.C.; Anthony King

(57) ABSTRACT

A current load circuit for testing a power supply circuit includes a control circuit and a load generation circuit. The control circuit is configured to generate a reset signal according to a clock signal. The load generation circuit is coupled to the control circuit and has several load configurations. The load generation circuit is configured to provide one of the load configurations as a current load of the load generation circuit according to the clock signal and the reset signal and receive a portion of the supply current provided by the power supply circuit according to the current load to generate an indication signal for indicating a performance of the power supply circuit.

20 Claims, 5 Drawing Sheets

CURRENT LOAD CIRCUIT AND CHIP FOR TESTING POWER SUPPLY CIRCUIT

CROSS-REFERENCE TO RELATED APPLICATIONS

This application claims the benefit of priority to patent application No. 110128912, filed in Taiwan on Aug. 5, 2021, which is incorporated by reference in its entirety.

TECHNICAL FIELD

The present application relates to a circuit and chip; in particular, to a circuit and chip for testing power supply circuit.

BACKGROUND

In electronic devices, the performance of the power supply circuit has a significant effect on the performance of the electronic devices. However, it is difficult to simulate and effectively test the performance of the power supply circuit before the power supply circuit is installed in an electronic device, and if the performance of the power supply circuit is not sufficient for the proper operation of the electronic device, it may be time-consuming and costly for debugging or redesigning. Therefore, how to effectively test the performance of power supply circuits has become an urgent issue in the related field.

SUMMARY OF THE INVENTION

An aspect of the present disclosure provides a current load circuit for testing a power supply circuit. The current load circuit includes a control circuit and a first load generation circuit. The current load circuit is configured to generate a first reset signal according to a clock signal. The first load generation circuit is coupled to the control circuit and has a plurality of first load configurations. The first load generation circuit is configured to alternately provide one of the plurality of first load configurations as a first current load of the first load generation circuit according to the clock signal and the first reset signal, and receive a first portion of a supply current provided by the power supply circuit according to the first current load to output an indication signal configured to indicate the performance of the power supply circuit.

Another aspect of the present disclosure provides a current load circuit for testing a power supply circuit. The current load circuit includes a first load generation circuit, a second load generation circuit, and a control circuit. The first load generation circuit has a plurality of first load configurations and is configured to, when being activated, alternately provide one of the plurality of first load configurations according to a clock signal to receive a first portion of a supply current provided by the power supply circuit so as to output a first indication signal configured to indicate the performance of the power supply circuit accordingly. The second load generation circuit has a plurality of second load configurations and is configured to, when being activated, alternately provide one of the plurality of second load configurations according to the clock signal to receive a second portion of the supply current provided by the power supply circuit so as to output a second indication signal configured to indicate the performance of the power supply circuit accordingly. The control circuit is configured to determine a time interval between the activation of the first load generation circuit and the second load generation circuit according to the clock signal Another aspect of the present disclosure provides a chip for testing a power supply circuit. The chip includes a phase locked loop and a current load circuit. The phase locked loop is coupled to the power supply circuit and configured to generate a clock signal. The current load circuit is coupled to the power supply circuit. The current load circuit includes a load generation circuit. The load generation circuit is configured to alternately provide one of a plurality of load configurations as a current load of the load generation circuit according to the clock signal and a reset signal. The current load circuit outputs an indication signal configured to indicates a performance of the power supply circuit according to the current load and by receiving a supply current provided by the power supply circuit The current load circuit and chip of the present application use different current load configurations to assemble a load circuit that can generate step currents and random currents to test the performance of the power supply circuit.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
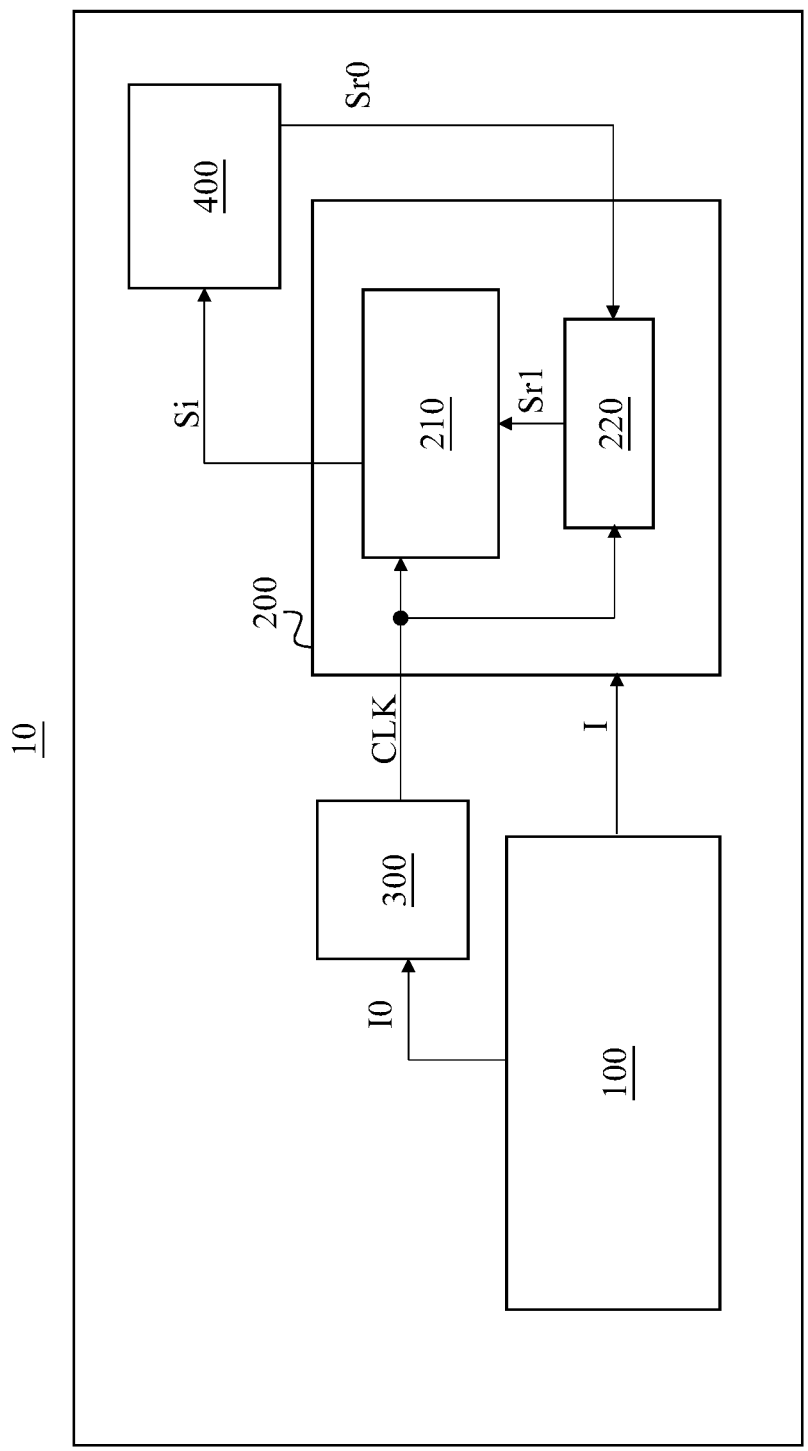
FIG. 1 is a schematic diagram illustrating a chip according to some embodiments of the present disclosure.

FIG. 1 is a schematic diagram illustrating a chip 10 according to some embodiments of the present disclosure. The chip 10 uses a current load circuit 200 to test a device under test (DUT) 100 and generate an indication signal Si configured to indicate the performance of the DUT 100 in providing the supply current I. In some embodiments, the DUT 100 is a power supply circuit. In further embodiments, the DUT 100 is a low-dropout regulator (LDO). As shown in FIG. 1, the DUT 100 is disposed on the chip 10, the supply current I is transmitted to the current load circuit 200 via the chip 10 itself, rather than through other package or printed circuit boards. Hence, the parasitic resistance, parasitic capacitor and/or parasitic inductance is smaller when the supply current I is transmitted from the DUT 100 to the current load circuit 200, so that the supply current I received by the current load circuit 200 has less interference, thereby increasing the accuracy for the current load circuit 200 to test the DUT 100.

The chip 10 further includes a phase locked loop 300 and control interface 400. The phase locked loop 300 is powered by the supply current 10 provided by the DUT 100, and configured to generate a clock signal CLK to transmit the same to the current load circuit 200 for its use. The control interface 400 is configured to receive an indication signal Si and provide a reset signal Sr0. In some embodiments, the control interface 400 is configured to transmit the indication signal Si to a display (not shown in FIG. 1) to display the performance of the DUT 100 for providing the supply current I to an external party. For example, the indication signal Si can indicate whether the DUT 100 has passed a performance test. The performance test can evaluate (however, the present application is not limited thereto) whether the supply current I provided by the DUT 100 meets a predetermined performance specification; for example, whether the supply current I can be maintained within a predetermined range. When the indication signal Si indicates that the DUT 100 has passed the performance test, the display can show that the performance of the DUT 100 for providing the supply current I meets the predetermined performance specification. When the indication signal Si indicates that the DUT 100 has failed the performance test, the display may show that the performance of the DUT 100 for providing the supply current I does not meet the predetermined performance specification. In other embodiments, the control interface 400 is configured to receive an external command to manipulate the reset signal Sr0 and transmit the reset signal Sr0 to the current load circuit 200, the details of which will be discussed below.

The current load circuit 200 has different current loads and switches between different current loads according to the clock signal CLK and the reset signal Sr0. Corresponding to different current loads, the current load circuit 200 can draw the supply currents I in different magnitudes from the DUT 100. When the DUT 100 supplies the supply current I, the current load circuit 200 generates the indication signal Si accordingly to indicate the performance of the DUT 100 for providing the supply current I.

For example, the current load circuit 200 can gradually increase (e.g., approximately the same value each step) the current load from 0 to a fixed value within a time interval; by adjusting the time interval, the current load circuit 200 can change the slew rate at which the DUT 100 provides the supply current I. Alternatively, for example, the current load circuit 200 can randomly switch between different current loads to simulate that other electronic device (such as a central processing unit) draws the supply current I; thereby, the ability of the DUT 100 for randomly providing the supply current I can be observed.

The current load circuit 200 includes a load generation circuit 210 and a control circuit 220. The control circuit 220 generates a reset signal Sr1 according to the clock signal CLK and the reset signal Sr0. The load generation circuit 210 has a plurality of load configurations that are switched on and off by the reset signal Sr1, and is configured to alternately provide one of the plurality of load configurations as the current load of the load generation circuit 210 according to the clock signal CLK. For example, the plurality of load configurations can serve as the current load of the load generation circuit 210. When the clock signal CLK is at a signal level, one of the load configurations can be used as the current load of the load generating circuit 210. When the clock signal CLK is at another signal level, the other one of the load configurations can be used as the current load of the load generating circuit 210. In addition, the load generating circuit 210 receives the supply current I according to the current load to output the indication signal Si.

Figure 2:
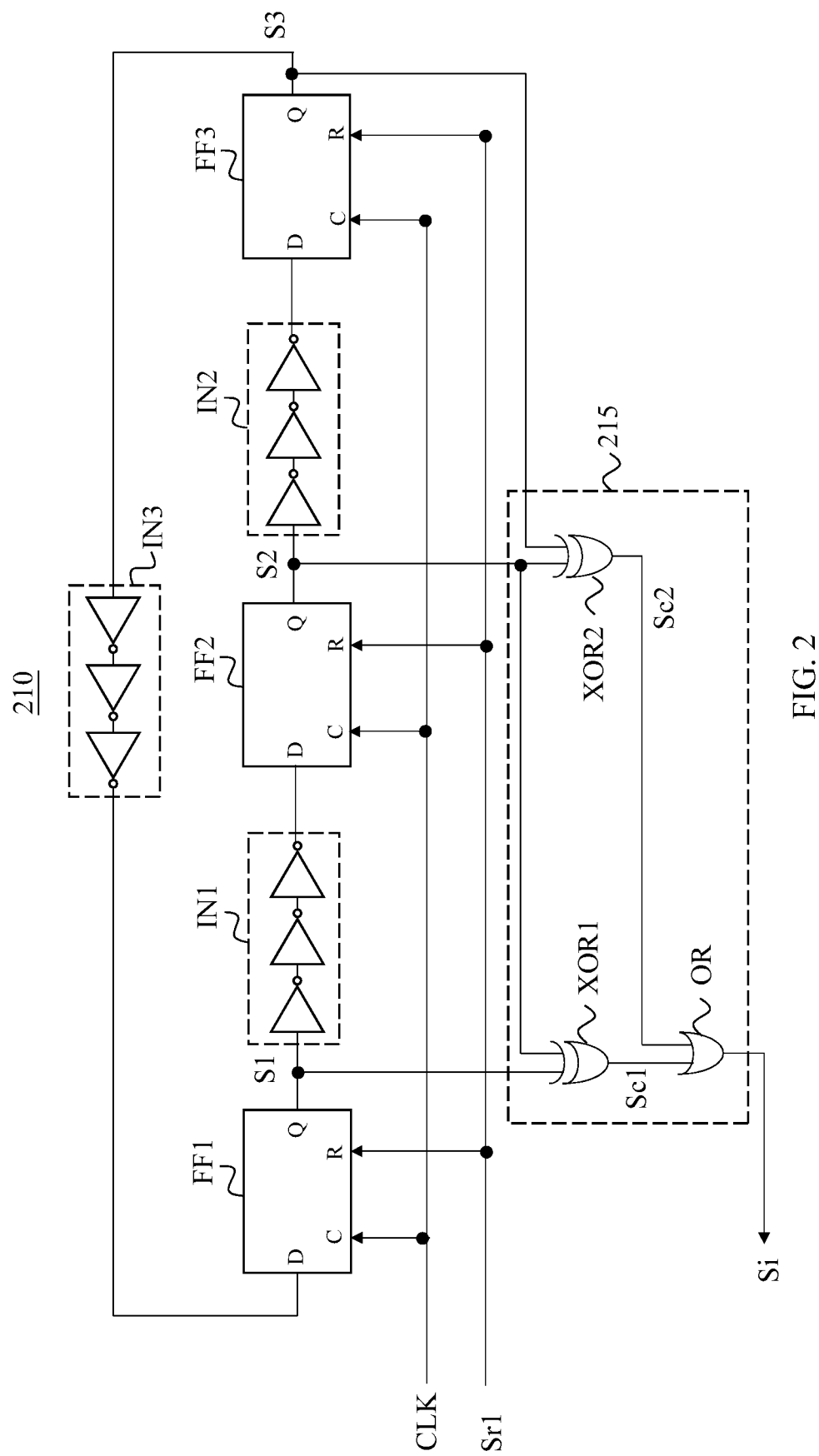
FIG. 2 is a schematic diagram illustrating a current load circuit according to some embodiments of the present disclosure.

Refer to FIG. 2. FIG. 2 is a schematic diagram illustrating the load generation circuit 210. The load generation circuit 210 includes a flip-flop FF1, a flip-flop FF2, a flip-flop FF3, an inverted series IN1, an inverted series IN2, an inverted series IN3, and a determining circuit 215. The inverted series IN1, the inverted series IN2, and the inverted series IN3 are coupled between the flip-flop FF1 and the flip-flop FF2, between the flip-flop FF2 and the flip-flop FF3, and between the flip-flop FF3 and the flip-flop FF1, respectively. The determining circuit 215 is coupled to the output terminals Q of the flip-flop FF1, the flip-flop FF2, and the flip-flop FF3, respectively. In some embodiments, the flip-flop FF1, the flip-flop FF2, and the flip-flop FF3 are D type flip-flop. The inverted series IN1, the inverted series IN2, and the inverted series IN3 each have an odd number of inverters connected in series to invert the received signal. In some embodiments, the inverted series IN1, the inverted series IN2, and the inverted series IN3 each have three inverters connected in series.

During to operation of the load generation circuit 210, all of the flip-flop FF1, the flip-flop FF2, the flip-flop FF3, the inverted series IN1, the inverted series IN2, and the inverted series IN3 consume the power provided by the supply current I for operating. For the sake of simplicity, the path related to receiving the supply current I is omitted from FIG. 2, and the supply current I is not shown in FIG. 2.

The flip-flop FF1 has an input terminal D, an output terminal Q, a clock receiving terminal C and a reset terminal R. The flip-flop FF1 is turned on or off by the reset terminal R by receiving the reset signal Sr1. When the reset signal Sr1 has the first logic level, the flip-flop FF1 is turned on and consumes the power provided by the supply current I. When the reset signal Sr1 has the second logic level, the flip-flop FF1 is turned off and stops consuming the power provided by the supply current I. When the flip-flop FF1 is turned on, the flip-flop FF1 outputs the signal which is inputted from the input terminal D to the output terminal Q according to the clock signal CLK received by the clock receiving terminal C to generate the load signal Si. In some embodiments, the first logic level represents digital logic 0 (logic 0), and the second logic level represents digital logic 1 (logic 1).

The flip-flop FF1, the flip-flop FF2, and the flip-flop FF3 are the same, and configured to generate the load signal S1, the load signal S2, and the load signal S3, at the output terminals Q, respectively. As shown in FIG. 2, the inverted series IN1 inverts the load signal S1 and transmits the same to the receiving terminal D of the flip-flop FF2. The flip-flop FF2 outputs the received signal in the next clock cycle to generate the load signal S2. Because the load generating circuit 210 includes three inverted series IN1~IN3, when the operation of the flip-flops FF1~FF3 converges, each flip-flop FF1~FF3 will generate a signal opposite to the signal under the previous clock cycle at the output terminal Q in the next clock cycle, and the load signals S1~S3 should have the same logic level in the same clock cycle. In other words, when the power provided by the supply current I is sufficient for the flip-flop FF1, the flip-flop FF2, the flip-flop FF3, the inverted series IN1, the inverted series IN2, and the inverted series IN3 for operating, there is no timing failure due to low voltage, and the load signal Si, the load signal S2, and the load signal S3 have the same logic level in sequence.

On the contrary, when the voltage provided by the supply current I is not enough to make the flip-flop FF1, the flip-flop FF2, the flip-flop FF3, the inverted series IN1, the inverted series IN2, and the inverted series IN3 to operate normally, timing failure occurs, and in the same clock cycle, the load signal S1 and the load signal S2 may have different logic levels, the load signal S2 and the load signal S3 may have different logic levels, and/or the load signals S3 and the load signal S1 may have different logic levels.

Because the flip-flop FF1, the flip-flop FF2, the flip-flop FF3, the inverted series IN1, the inverted series IN2, and the inverted series IN3 consume different power when outputting different logic levels, they have different load configurations. Hence, the load generation circuit 210 as a whole, alternately using different load configurations as the current load of the load generation circuit 210, according to the clock period of the clock signal CLK when the flip-flop FF1, the flip-flop FF2, and the flip-flop FF3 are activated.

The determining circuit 215 is configured to determine whether the operation of the load generation circuit 210 encounters timing failure according to the load signal Si, the load signal S2, and the load signal S3, and then determine whether the performance of the DUT 100 for providing the supply current I is satisfactory (i.e., whether it passes the DUT 100 performance test). The determining circuit 215 includes an exclusive OR gate XOR1, an exclusive OR gate XOR2, and an OR gate OR. The exclusive or gate XOR1 is configured to perform an exclusive OR logic operation on the load signal Si and the load signal S2 to generate an operation signal Sc1, and the exclusive or gate XOR2 is configured to perform the exclusive OR logic operation on the load signal S2 and the load signal S3 to generate an operation signal Sc2. The OR gate OR is configured to perform an OR logic operation on the operation signal Sc1 and the operation signal Sc2 to generate the indication signal Si.

When the load signal SI, the load signal S2, and the load signal S3 have the same logic level in sequence, both the operation signal Sc1 and operation signal Sc2 have the first logic level (logic 0), so that the indication signal Si has the first logic level (logic 0), which indicates that the performance of the DUT 100 is satisfactory. When the load signal Si and load signal S2 have different logic levels, the load signal S2 and the load signal S3 have different logic levels, and/or the load signal S3 and the load signal S1 have different logic levels, the operation signal Sc1 and/or the operation signal Sc2 have the second logic level (logic 1), so that the indication signal Si has the second logic level, which indicates that the performance of the DUT 100 is not satisfactory. That is, when any of the operation signal Sc1 and the operation signal Sc2 has the second logic level, the indication signal Si has the second logic level.

Figure 3:
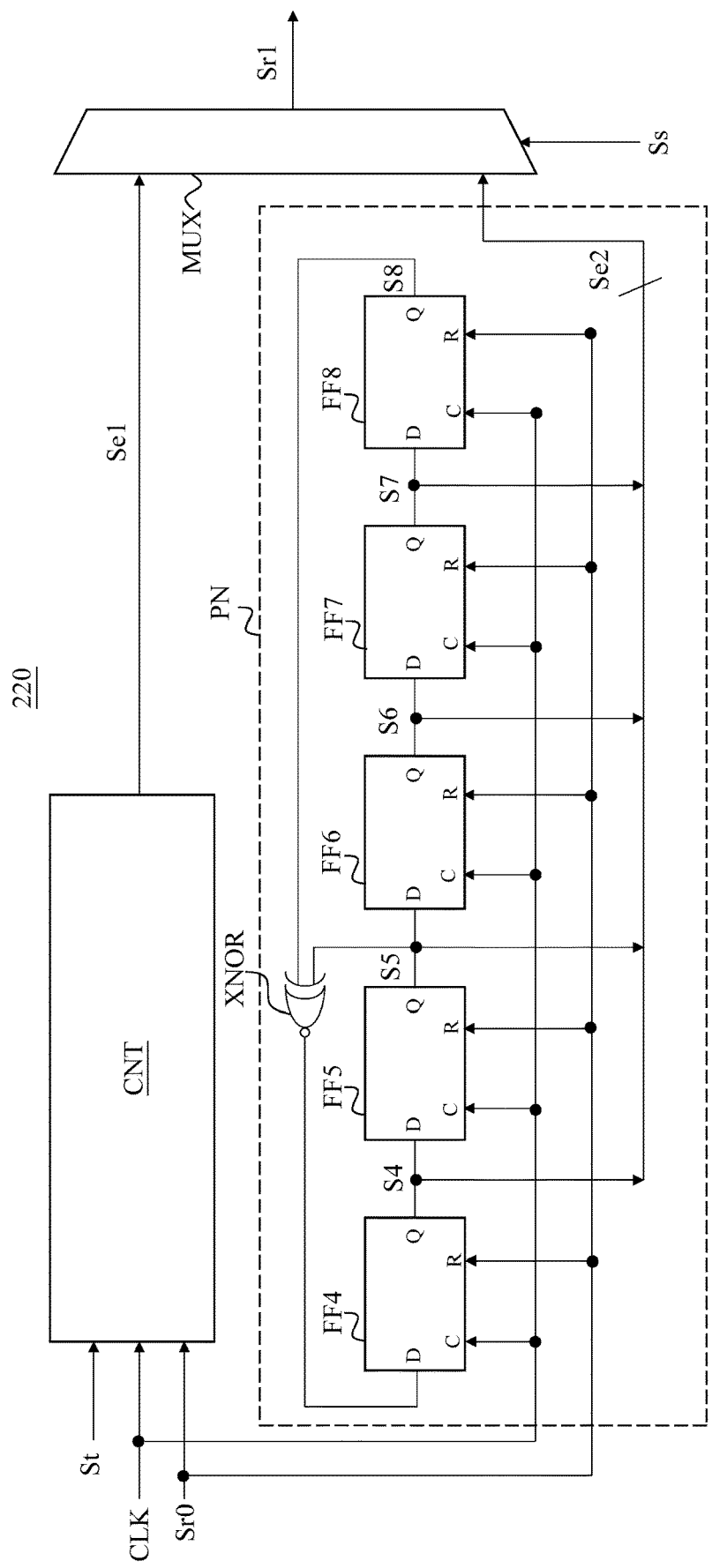
FIG. 3 is a schematic diagram illustrating a control circuit according to some embodiments of the present disclosure.

Refer to FIG. 3. FIG. 3 is a schematic diagram illustrating the control circuit 220. The control circuit 220 includes a counter circuit CNT, a random number generator PN, and a selector MUX. The counter circuit CNT is configured to count the number of cycles of the clock signal CLK to generate an enable signal Se1. The random number generator PN is configured to randomly generate an enable signal Se2. The selector MUX is configured to selectively outputs the enable signal Se1 or the enable signal Se2 as the reset signal Sr1.

The counter circuit CNT is switched on and off by the control of the reset signal Sr0. When being switched on, the counter circuit CNT counts the number of cycles of the clock signal CLK according to a setting signal St, wherein the setting signal St is configured to indicate a predetermined number of the number of cycles to be counted. In some embodiments, the setting signal St is transmitted to the control circuit 220 via the control interface 400, however, the present application is not limited thereto. When the number of cycles of the clock signal CLK reaches the predetermined number, the counter circuit CNT generates the enable signal Se1.

In some embodiments, the random number generator PN can be a pseudorandom number generator, however, the present application is not limited thereto. The random number generator PN includes a flip-flop FF4, a flip-flop FF5, a flip-flop FF6, a flip-flop FF7, a flip-flop FF8, and an exclusive NOR gate XNOR. The flip-flops FF4-FF8 are the same as the flip-flop FF1-FF3 in FIG. 2. As shown in FIG. 3, the flip-flops FF4-FF8 are coupled in series, the exclusive NOR gate XNOR is coupled between the flip-flop FF4 and the output terminal Q of the flip-flop FF8. The flip-flops FF4-FF8 are switched on and off by the control of the reset signal Sr0. When the flip-flops FF4-FF8 are on, the flip-flops FF4-FF8 are configured to generate a signal S4, a signal S5, a signal S6, a signal S7, and a signal S8 at the output terminals, respectively, according to the clock signal CLK. The flip-flops FF4-FF8, in conjunction with the operation of the exclusive NOR gate XNOR, continuously updates the signals S4-S8 according to the clock signal CLK, so as to generate pseudo-randomly changing signals S4-S8 within a certain number of cycles of the clock signal CLK. The random number generator PN outputs the signals S4-S8 as the enabling signal Se2.

The selector MUX is configured to receive the enable signal Se1 and the enable signal Se2, and select one of the enable signal Se1 and the enable signal Se2 to output the same as the reset signal Sr1, according to the selection signal Ss.

In some embodiments, the control circuit 220 only includes the counter circuit CNT. The control circuit 220 directly outputs the enable signal Se1 generated by the counter circuit CNT as the reset signal Sr1.

Figure 4:
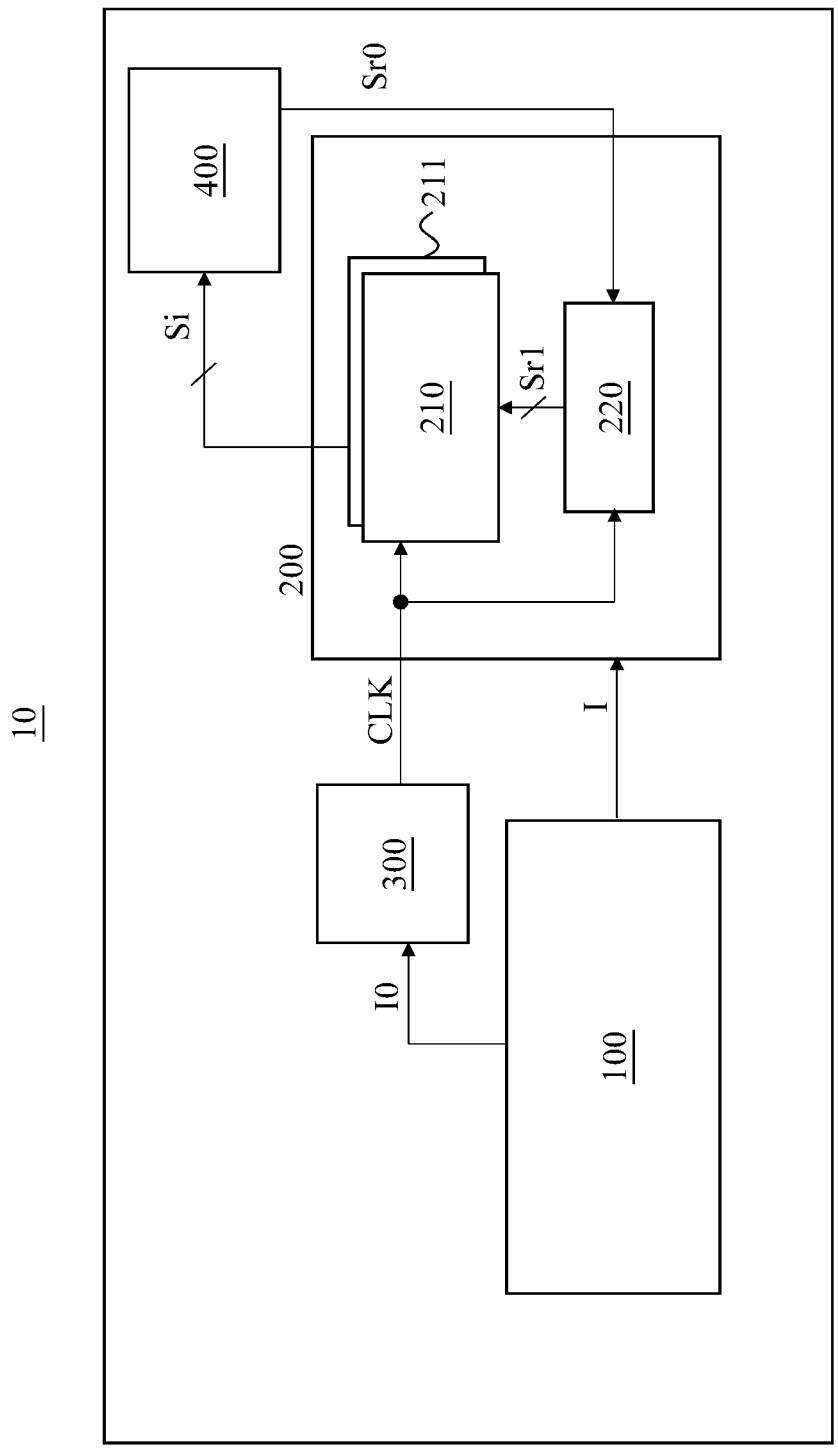
FIG. 4 is a schematic diagram illustrating a chip according to other embodiments of the present disclosure.

In some embodiments, the current load circuit 200 includes a plurality of load generation circuits, e.g., the load generation circuit 210 and a load generation circuit 211 that are arranged in parallel, as shown in FIG. 4. In some embodiments, the load generation circuits 210 and 211 are the same and have the same load configurations. The control circuit 220 generates a plurality of reset signals Sr1 to respectively control the load generation circuits 210 and 211. In some embodiments, reference is also made to FIG. 3, the setting signal St indicates two different predetermined numbers, the counter circuit CNT counts the different numbers of cycles according to the setting signal and generates two enable signals Se1, and the control circuit 220 outputs the two enable signals Se1 as two different reset signals Sr1. The control circuit 220 controls the load generation circuits 210 and 211 to sequentially turn on and switch to the same current load during a fixed time period, so that the supply current I drawn by the current load circuits 210 and 211 as a whole increases gradually (e.g., approximately the same value each step) during the fixed time period. In other words, the control circuit 220 controls the interval at which the load generation circuits 210 and 211 turn on according to the clock signal CLK and the setting signal St. According to the above-mentioned operations, the time interval at which the load generation circuits 210 and 211 are turned on is determined by the reset signal Sr1, and in this way, the slew rate of the supply current I is determined.

Figure 5:
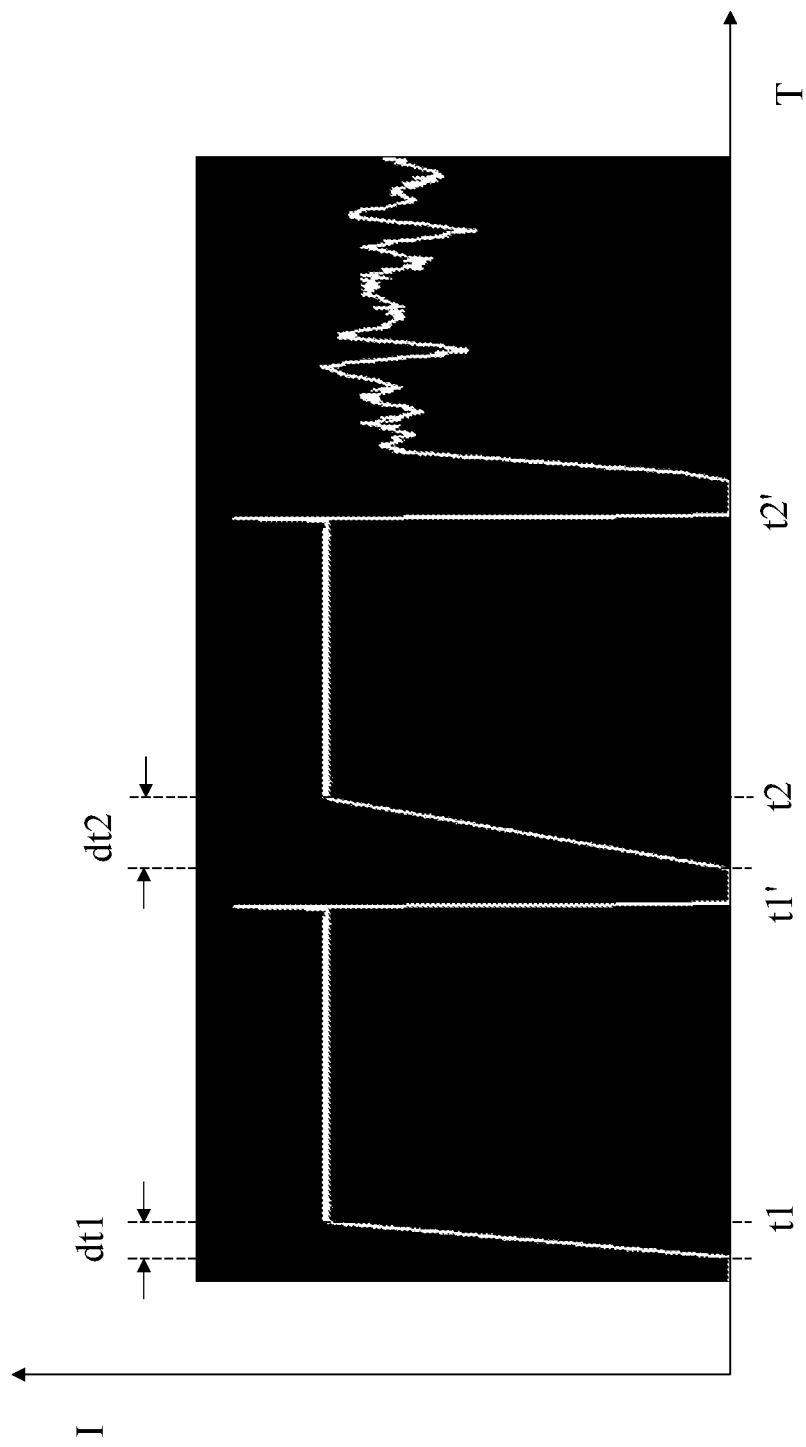
FIG. 5 is a waveform diagram according to other embodiments of the present disclosure.

Refer to FIG. 5 concurrently. FIG. 5 is a waveform diagram of the supply current I that the current load circuits 210 and 211 draw under different current loads, wherein the horizontal axis represents time T, and the vertical axis represents the supply current I. The time interval dt1 is time interval from the time that the control circuit 220 turns on the current load circuit 210 to the time that the control circuit 220 completes turning on the current load circuit 211. When the control circuit 220 changes the original time interval dt1 to a time interval dt2, the way that the supply current I changes in response to the current load can be known by observing the current CL1 and current CL2, thereby ascertaining the behavior of the supply current I under different slew rates, wherein the current CL1 represents the current change of the supply current I corresponding to the activation of the current load circuits 210 and 211 in sequence based on the time interval dt1, and the current CL2 represents the current change of the supply current I corresponding to the activation of the current load circuits 210 and 211 in sequence based on the time interval dt2. When the time interval dt1 is smaller than time interval dt2, the slew rate of the current CL1 may be greater than the slew rate of the current CL2. In this embodiment, during the time point t1 and the time point t1', the current CL1 may be in (or substantially in) a current level, which is the current level of the supply current I in a stable state after the current load circuit 210 and the current load circuit 211 finish activation. Similarly, during the time point t2 and the time point t2', the current CL2 may be in (or substantially in) a current level, which is the current level of the supply current I in a stable state after the current load circuit 210 and the current load circuit 211 finish activation In some other embodiments, the selector MUX in the control circuit 220 selects to output the enable signal Se2 as the reset signal Sr1 and controls the load generation circuits 210 and 211 accordingly. Because the enable signal Se2 is generated randomly, when the load generation circuits 210 and 211, as a whole, are turned on, the two have a random current load; for example, the current CL3 in FIG. 5 shows the current load that changes randomly.

The foregoing description briefly sets forth the features of certain embodiments of the present application so that persons having ordinary skill in the art more fully understand the various aspects of the disclosure of the present application. It will be apparent to those having ordinary skill in the art that they can easily use the disclosure of the present application as a basis for designing or modifying other processes and structures to achieve the same purposes and/or benefits as the embodiments herein. It should be understood by those having ordinary skill in the art that these equivalent implementations still fall within the spirit and scope of the disclosure of the present application and that they may be subject to various variations, substitutions, and alterations without departing from the spirit and scope of the present disclosure.

What is claimed is:

1. A current load circuit for testing a power supply circuit, comprising:
    a control circuit, configured to generate a first reset signal according to a clock signal; and
    a first load generation circuit, coupled to the control circuit and having a plurality of first load configurations, wherein the first load generation circuit is configured to alternately provide one of the plurality of first load configurations as a first current load of the first load generation circuit according to the clock signal and the first reset signal, and receive a first portion of a supply current provided by the power supply circuit according to the first current load to output an indication signal configured to indicate the performance of the power supply circuit.

2. The current load circuit of claim 1, wherein the first load generation circuit is activated according to the first reset signal, and the first load generation circuit switches the plurality of first load configurations according to a clock period of the clock signal.

3. The current load circuit of claim 1, wherein the first load generation circuit comprises:

a first flip-flop, a second flip-flop, and a third flip-flop, configured to generate a first load signal, a second load signal, and a third load signal respectively, according to the clock signal and the first reset signal;
    a first inverted series, a second inverted series, and a third inverted series, respectively coupled between the first flip-flop and the second flip-flop, between the second flip-flop and the third flip-flop, and between the third flip-flop and the first flip-flop; and
    a determining circuit, coupled to the first flip-flop, the second flip-flop, and the third flip-flop, configured to generate the indication signal according to the first load signal, the second load signal, and the third load signal.

4. The current load circuit of claim 3, wherein when the first load signal, the second load signal, and the third load signal have the same logic level in sequence, the indication signal indicates that the power supply circuit has passed a performance test.

5. The current load circuit of claim 3, wherein when the first load signal and the second load signal have different logic levels, the indication signal indicates that the power supply circuit has failed a performance test.

6. The current load circuit of claim 3, wherein the first inverted series, the second inverted series, and the third inverted series each comprise an odd number of inverters connected in series with each other.

7. The current load circuit of claim 3, wherein the determining circuit comprises:
    a first XOR gate, configured to perform an exclusive OR logic operation on the first load signal and the second load signal to generate a first operation signal;
    a second XOR gate, configured to perform the exclusive OR logic operation on the second load signal and the third load signal to generate a second operation signal; and
    an OR gate, configured to perform an OR logic operation on the first operation signal and the second operation signal to generate the indication signal.

8. The current load circuit of claim 1, wherein the control circuit is further configured to generate a second reset signal according to the clock signal, and the current load circuit further comprises:
    a second load generation circuit, coupled to the control circuit and has a plurality of second load configurations, wherein the second load generation circuit is configured to be activated according to the second reset signal, and alternately provide one of the plurality of second load configurations as a second current load of the second load generation circuit according to the clock period of the clock signal, and receive a second portion of the supply current provided by the power supply circuit according to the second current load, wherein a slew rate of the supply current is determined at least according to the first reset signal and the second reset signal.

9. The current load circuit of claim 8, wherein the control circuit comprises:
    a counter circuit, configured to count a number of cycles of the clock signal, wherein when the number of cycles of the clock signal reaches a first predetermined value, the counter circuit is configured to generate a first enable signal as the first reset signal to reset the first current load, and when the number of cycles of the clock signal reaches a second predetermined value, the counter circuit is configured to generate a second enable signal as the first reset signal to reset the second current load.

10. The current load circuit of claim 8, wherein the control circuit comprising:
 a counter circuit, configured to count the number of cycles of the clock signal, wherein when the number of cycles of the clock signal reaches a first predetermined value, the counter circuit is configured to generate a first enable signal, and when the number of cycles of the clock signal reaches a second predetermined value, the counter circuit is configured to generate a second enable signal;
 a random number generator, configured to randomly generate a third enable signal and a fourth enable signal according to the clock signal; and
 a selector, configured to output the first enable signal and the second enable signal as the first reset signal and the second reset signal, respectively, according to a selection signal, or output the third enable signal and the fourth enable signal as the first reset signal and the second reset signal, respectively, according to the selection signal.

11. A current load circuit for testing a power supply circuit, comprising:
 a first load generation circuit, having a plurality of first load configurations and configured to, when being activated, alternately provide one of the plurality of first load configurations according to a clock signal to receive a first portion of a supply current provided by the power supply circuit so as to output a first indication signal configured to indicate the performance of the power supply circuit accordingly;
 a second load generation circuit, having a plurality of second load configurations and configured to, when being activated, alternately provide one of the plurality of second load configurations according to the clock signal to receive a second portion of the supply current provided by the power supply circuit so as to output a second indication signal configured to indicate the performance of the power supply circuit accordingly; and
 a control circuit, configured to determine a time interval between the activation of the first load generation circuit and the second load generation circuit according to the clock signal.

12. The current load circuit of claim 11, wherein,
 the control circuit is further configured to generate a first reset signal and a second reset signal according to the clock signal, and
 the first load generation circuit alternately switches into one of the plurality of first load configurations to form a first current load of the first load generation circuit according to the clock signal, and the second load generation circuit alternately switches into one of the plurality of second load configurations to form a second current load of the second load generation circuit according to clock signal.

13. The current load circuit of claim 12, wherein the first load generation circuit comprises:
 a first flip-flop, a second flip-flop, and a third flip-flop, configured to generate a first load signal, a second load signal, and a third load signal, respectively, according to the clock signal and the first reset signal;
 a first inverted series, a second inverted series, and a third inverted series, coupled between the first flip-flop and the second flip-flop, between the second flip-flop and the third flip-flop, and between third flip-flop and the first flip-flop, respectively, and a first determining circuit, coupled to the first flip-flop, the second flip-flop, and the third flip-flop and configured to generate the first indication signal according to the first load signal, the second load signal, and the third load signal.

14. The current load circuit of claim 13, wherein when the first load signal, the second load signal, and the third load signal have the same logic level in sequence, the first indication signal indicates that the power supply circuit has passed a performance test.

15. The current load circuit of claim 13, wherein when the first load signal and the second load signal have different logic levels, the first indication signal indicates that the power supply circuit has failed a performance test.

16. The current load circuit of claim 13, wherein the first determining circuit comprises:
 a first XOR gate, configured to perform an exclusive OR logic operation on the first load signal and the second load signal to generate a first operation signal;
 a second XOR gate, configured to perform the exclusive OR logic operation on the second load signal and the third load signal to generate a second operation signal; and
 an OR gate, configured to perform an OR logic operation on the first operation signal and the second operation signal to generate the first indication signal.

17. The current load circuit of claim 12, wherein the control circuit comprises:
 a counter circuit, configured to count a number of cycles of the clock signal, wherein when the number of cycles of the clock signal reaches a first predetermined value, the counter circuit is configured to generate a first enable signal as the first reset signal to reset the first current load, and when the number of cycles of the clock signal reaches a second predetermined value, the counter circuit is configured to generate a second enable signal as the first reset signal to reset the second current load.

18. The current load circuit of claim 12, wherein the control circuit comprises:
 a counter circuit, configured to count a number of cycles of the clock signal, wherein when the number of cycles of the clock signal reaches a first predetermined value, the counter circuit is configured to generate a first enable signal, and when the number of cycles of the clock signal reaches a second predetermined value, the counter circuit is configured to generate a second enable signal;
 a pseudorandom number generator, configured to randomly generate a third enable signal and a fourth enable signal according to the clock signal; and
 a selector, configured to output the first enable signal and the second enable signal as the first reset signal and the second reset signal, respectively, according to a selection signal, or output the third enable signal and the fourth enable signal as the first reset signal and the second reset signal, respectively, according to the selection signal.

19. A chip for testing a power supply circuit, comprising:
 a phase locked loop, coupled to the power supply circuit and configured to generate a clock signal; and
 a current load circuit, coupled to the power supply circuit, wherein the current load circuit comprises:
  a load generation circuit, configured to alternately provide one of a plurality of load configurations as a current load of the load generation circuit according to the clock signal and a reset signal, wherein the current load circuit outputs an indication signal configured to indicate a performance of the power supply circuit according to the current load and by receiving a supply current provided by the power supply circuit.

20. The chip of claim 19, wherein the current load circuit further comprises a control circuit, configured to generate the reset signal according to the clock signal, wherein the load generation circuit comprises:
   a first flip-flop, a second flip-flop, and a third flip-flop, configured to generate a first load signal, a second load signal, and a third load signal, respectively, according to the clock signal and the reset signal;
   a first inverted series, a second inverted series, and a third inverted series, coupled between the first flip-flop and the second flip-flop, between the second flip-flop and the third flip-flop, and between the third flip-flop and the first flip-flop, respectively; and
   a determining circuit, comprising:
      a first XOR gate, configured to perform an exclusive OR logic operation on the first load signal and the second load signal to generate a first operation signal;
      a second XOR gate, configured to perform the exclusive OR logic operation on the second load signal and the third load signal to generate a second operation signal; and
      an OR gate, configured to perform an OR logic operation on the first operation signal and the second operation signal to generate the indication signal.

* * * * *